United States Patent
Guillou et al.

(10) Patent No.: US 12,072,559 B2
(45) Date of Patent: Aug. 27, 2024

(54) ELECTRICALLY-CONTROLLED OPTICAL DEVICE WITH A FRONT SHELL

(71) Applicant: Essilor International, Charenton-le-Pont (FR)

(72) Inventors: Hélène Guillou, Charenton-le-Pont (FR); Claudine Biver, Charenton-le-Pont (FR); Sira Uhalte Nogues, Charenton-le-Pont (FR); David Escaich, Charenton-le-Pont (FR); Masaaki Imura, Ostu (JP)

(73) Assignee: Essilor International, Charenton-le-Pont (FR)

( * ) Notice: Subject to any disclaimer, the term of this patent is extended or adjusted under 35 U.S.C. 154(b) by 841 days.

(21) Appl. No.: 16/972,799

(22) PCT Filed: Jun. 7, 2019

(86) PCT No.: PCT/EP2019/065032
§ 371 (c)(1),
(2) Date: Dec. 7, 2020

(87) PCT Pub. No.: WO2019/238585
PCT Pub. Date: Dec. 19, 2019

(65) Prior Publication Data
US 2021/0247628 A1    Aug. 12, 2021

(30) Foreign Application Priority Data
Jun. 15, 2018  (EP) ..................................... 18305733

(51) Int. Cl.
*G02C 7/10*   (2006.01)
*B29D 11/00*  (2006.01)
(Continued)

(52) U.S. Cl.
CPC ........ *G02C 7/101* (2013.01); *B29D 11/00038* (2013.01); *C23C 14/34* (2013.01); *G02C 7/022* (2013.01); *G02C 2202/16* (2013.01)

(58) Field of Classification Search
None
See application file for complete search history.

(56) References Cited

U.S. PATENT DOCUMENTS 3,245,315 A * 4/1966 Marks ................... G02F 1/0327
                                                   351/44
5,496,641 A    3/1996 Mase et al.
(Continued)

FOREIGN PATENT DOCUMENTS

CN    102023332 A    4/2011
JP    63-141001 A    6/1988
(Continued)

OTHER PUBLICATIONS

International Search Report and Written Opinion issued on Aug. 8, 2019 in PCT/EP2019/065032 filed on Jun. 7, 2019.
(Continued)

*Primary Examiner* — Darryl J Collins
(74) *Attorney, Agent, or Firm* — Oblon, McClelland, Maier & Neustadt, L.L.P.

(57) ABSTRACT

An electrically-controlled optical device intended to be placed in front of a user's eye, the electrically-controlled optical device being an ophthalmic device, the electrically-controlled optical device comprising: a front shell defining a front surface and a back surface opposed to the front surface, the front shell comprising a slab, at least one functional layer arranged on the back surface and one primer layer, said primer layer being arranged between the at least one functional layer and the slab; and an electrically-controlled object facing the back surface of the front shell wherein the primer layer is conformed such that the elec-
(Continued)

trically-controlled optical device is mechanically resistant to an impact energy of at least 200 mJ.

15 Claims, 2 Drawing Sheets

(51) Int. Cl.
*C23C 14/34* (2006.01)
*G02C 7/02* (2006.01)

(56) References Cited

U.S. PATENT DOCUMENTS

| | | | |
|---|---|---|---|
| 6,070,979 | A | 6/2000 | Kagei et al. |
| 6,503,631 | B1 | 1/2003 | Faverolle et al. |
| 2002/0071091 | A1 | 6/2002 | Degand et al. |
| 2007/0242173 | A1* | 10/2007 | Blum .................. G02F 1/1345 349/13 |
| 2011/0043902 | A1 | 2/2011 | Ishibashi et al. |
| 2012/0229754 | A1* | 9/2012 | Iyer .................. G02C 7/083 351/159.4 |
| 2012/0300171 | A1* | 11/2012 | Gupta .............. G02B 27/0025 623/6.22 |
| 2013/0038834 | A1 | 2/2013 | Cado et al. |
| 2013/0141693 | A1 | 6/2013 | McCabe et al. |
| 2013/0155373 | A1 | 6/2013 | Cado et al. |
| 2014/0009734 | A1 | 1/2014 | Cado et al. |
| 2014/0043672 | A1* | 2/2014 | Clarke ................ G02F 1/1313 359/315 |
| 2014/0368788 | A1 | 12/2014 | Cado et al. |
| 2015/0261009 | A1 | 9/2015 | Boulton |
| 2017/0023797 | A1 | 1/2017 | Cado et al. |
| 2017/0235203 | A1* | 8/2017 | Yamamoto ........... C07C 219/32 359/268 |
| 2019/0072782 | A1 | 3/2019 | Cado et al. |
| 2019/0324289 | A1* | 10/2019 | Glöge ............. B29D 11/00403 |
| 2021/0191158 | A1 | 6/2021 | Biver et al. |

FOREIGN PATENT DOCUMENTS

| | | |
|---|---|---|
| JP | 9-113852 A | 5/1997 |
| JP | 2014-531058 A | 11/2014 |
| WO | WO 00/08493 A1 | 2/2000 |
| WO | WO 00/50928 A1 | 8/2000 |
| WO | WO 00/77559 A1 | 12/2000 |
| WO | WO 2012/076714 A1 | 6/2012 |
| WO | WO 2016/021129 A1 | 2/2016 |

OTHER PUBLICATIONS

Office Action issued Feb. 6, 2023, in corresponding Japanese Patent Application No. 2020-565967, (with English Translation), 7 pages.
Combined Chinese Office Action and Search Report issued Nov. 30, 2021, of the corresponding Chinese Patent Application No. 201980029912.2, (with English Translation), 13 pages.

* cited by examiner

ELECTRICALLY-CONTROLLED OPTICAL DEVICE WITH A FRONT SHELL

FIELD OF THE INVENTION

The invention relates to an electrically-controlled optical device.

The invention further relates to a method for manufacturing an electrically-controlled optical device.

BACKGROUND OF THE INVENTION

When manufacturing a new optical element, it is necessary to take into account that in case of an accidental impact with sufficient force, the optical element may shatter. As a consequence, pieces of the optical element may break away and damage the eye of the wearer.

The choice of material is important because it affects the weight and thickness of the optical element and its resistance to shocks. There are two main types of transparent materials used in optical devices: organic materials, like polycarbonate, and mineral glass, like BK7.

In addition, eyewear having a specific function, such as an electrically-controlled optical device, may require applying a coating on a surface of an optical element. However, some coatings are known to have a detrimental effect on resistance to impacts.

Limitations on the choice of materials arise from the nature of the function to be applied and from the conditions applied on the optical element during manufacturing and during use.

Therefore, there is a need for an electrically-controlled optical device which does not damage the wearer eyes by shattering in case of an accidental impact.

One object of the present invention is to provide such device.

Another object of the invention is to provide a method for manufacturing such device.

SUMMARY OF THE INVENTION

To this end, the invention proposes an electrically-controlled optical device intended to be placed in front of a user's eye, the electrically-controlled optical device being an ophthalmic device, the electrically-controlled optical device comprising:
  a front shell defining a front surface and a back surface opposed to the front surface, the front shell comprising a slab, at least one functional layer arranged on the back surface and one primer layer, said primer layer being arranged between the at least one functional layer and the slab; and
  an electrically-controlled object facing the back surface of the front shell
wherein the primer layer is conformed such that the electrically-controlled optical device is mechanically resistant to an impact energy of at least 200 mJ.

Advantageously, the electrically-controlled optical device of the invention has an improved impact resistance due to the primer layer over known electrically-controlled optical devices, without the total thickness or weight being significantly increased.

Advantageously, the electrically-controlled optical device according to the invention is able to prevent the front shell to fracture or shatter when the front shell is submitted to the FDA drop ball test. In other words, the invention prevents pieces to be detached because the front shell does not break with this test and an impact energy of 200 mJ, thus protecting the eye of the user from being reached by any broken pieces of the front shell, thanks to the primer layer.

According to embodiments, the electrically-controlled optical device according to the invention may further comprise one or several of the following features according to any possible combination:
  the slab is made of mineral material; and/or
  the front shell is less than 1.7 mm thick, preferably less than 1.4 mm thick; more preferably less than 1.0 mm thick and/or
  the front shell is configured to form a plano optical lens and/or a convex optical lens and/or a concave optical lens, preferably an ophthalmic lens; and/or
  the front shell has a dioptric function, for example adapted to the prescription of a user; and/or
  the primer layer has a thickness less than 4 µm, notably less than 3 µm, advantageously less than 2 µm; and/or
  the primer layer is resistant to a temperature of at least 100° C., preferably 200° C., notably at least 250° C., advantageously at least 300° C.; and/or
  the primer layer is made of a polymer or a sol-gel material or a composite organic/inorganic material; and/or
  the primer layer is configured to form a refractive index adaptative layer; and/or
  the electrically-controlled optical device further comprises a back shell facing the front shell, the back shell being arranged such that the electrically-controlled optical object being located between the back shell and the front shell; and/or
  the back surface of the front shell is concave; and/or
  the at least one functional layer comprises an antireflective coating; and/or
  the at least one functional layer comprises a transparent conductive layer, preferably made of indium-tin oxide, indium zinc oxide, aluminum zinc oxide, gallium zinc oxide; and/or
  the electrically-controlled optical object comprises an element placed in electrical contact with the conductive layers, the element being selected from the group consisting of a liquid crystals layer, an electrochromic material layer; and/or
  the electrically-controlled optical object comprises a further element selected from the group consisting of an electrically-controlled active lens, a spatial light modulator, a waveguide and a holographic structure; and/or
  the electrically-controlled optical device has a dioptric function, for example adapted to the prescription of the user, and/or
  the electrically-controlled optical device has a transmittance function, for example adapted to actively protect against glare; and/or
  the electrically-controlled optical device is a head-mounted device, preferably a head mounted display.

Moreover, the invention proposes a method for manufacturing a front shell of an electrically-controlled optical device intended to be placed before a user's eye, the method comprising the following steps:
  a step of providing a slab having a front surface and a back surface;
  a step of depositing a primer layer on at least the back surface of the slab;
  a step of curing the primer layer deposited on the slab at a curing temperature; and
  a step of applying at least one functional layer on the primer layer so that the at least one functional layer is arranged on at least the back surface of the front shell.

According to embodiments, the method for manufacturing an electrically-controlled optical device according to the invention may further comprise one or several of the following features according to any possible combination:

- the at least one functional layer is applied through a sputtering method at a predetermined sputtering temperature; and/or
- the predetermined sputtering temperature is higher than 100° C., preferably 200° C., notably higher than 250° C., advantageously higher than or equal to 300° C.

BRIEF DESCRIPTION OF THE DRAWINGS

Embodiments of the invention will now be described, by way of examples only, and with reference to the following drawings in which.

Elements in the figures are illustrated for simplicity and clarity and have not necessarily been drawn to scale. For example, the dimensions of some of the elements in the figures may be exaggerated relative to other elements to help improve the understanding of the embodiments of the present invention. Unless specified otherwise, each surface of an element which is represented on the figures as concave may also be convex and vice versa.

DETAILED DESCRIPTION OF PREFERRED EMBODIMENTS

The invention relates to an electrically-controlled optical device intended to be placed before a user's eye, the electrically-controlled optical device being an ophthalmic device.

The invention relates to any kind of electrically-controlled optical device, including active lenses, virtual reality devices, augmented reality devices, LCD displays, e-focus lenses (know as lenses including an active focus or dynamic vision correction), active polarizing devices. The electrically-controlled optical device may comprise any optical element which may be included in eyewear, such as a solar lens, an electrochromic cell, a light guide, a holographic mirror. The electrically-controlled optical device may comprise a standard or a specific frame, such as an electronic frame.

In some embodiments, the electrically-controlled optical device is a head-mounted device, preferably a head-mounted display.

In some embodiments, the electrically-controlled optical device has a dioptric function, for example adapted to the prescription of the user. In embodiments, the dioptric function may be controlled by the electrically-controlled optical device.

In some embodiments, the electrically-controlled optical device has a transmittance function, for example adapted to actively protect against glare. This function can be implemented with an electrochromic device.

Figure 1:
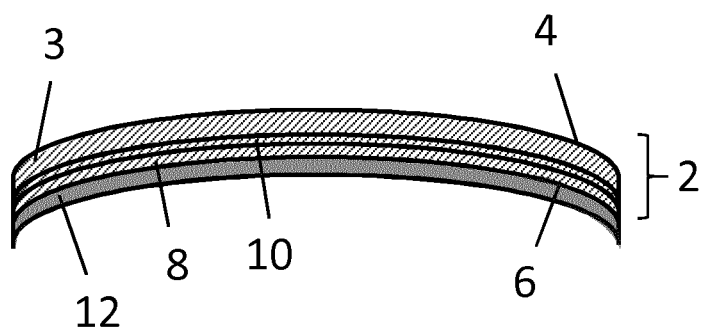
FIGS. 1 and 1B are general profile views of electrically-controlled optical devices according to the invention.
Figure 1B:
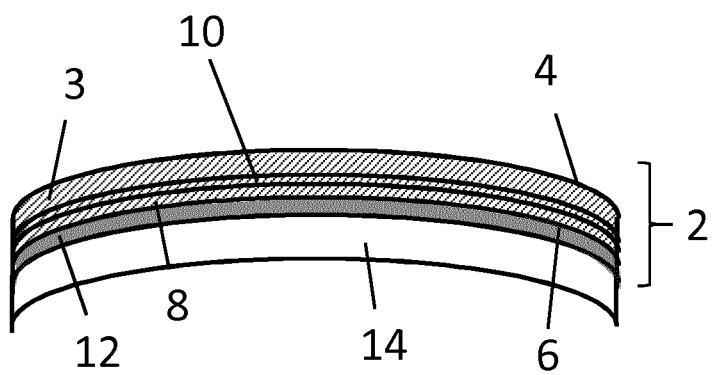

As illustrated on FIGS. 1 and 1B, the electrically-controlled optical device according to the invention comprises at least:

- a front shell 2 (represented striped on FIGS. 1 and 1B); and
- an electrically-controlled object 12 (represented gray on FIGS. 1 and 1B).

According to the invention, the front shell 2 defines a front surface 4 and a back surface 6 opposed to the front surface 4. The back surface 6 corresponds to the surface of the front shell 2 intended to be the closest to the user's eye when the optical lens is placed before a user's eye.

The front shell 2 comprises a slab 3.

In the sense of the invention, the slab 3 defines a front surface oriented towards the front surface of the front shell and a back surface oriented towards the back surface of the front shell. The slab 3 may be planar or curved.

In embodiments, the slab 3 is made of mineral material, particularly mineral glass. Advantageously, a mineral material sustains higher temperatures compared to organic materials such as polyurethane or acrylic polymers or copolymers or mixtures of them. Advantageously, a mineral material resists to manufacturing conditions involving heating at temperatures above 250° C. Advantageously, mineral glass is a very transparent material and a very good barrier to oxygen and humidity.

In embodiments, the front shell 2 is less than 1.7 mm thick, preferably less than 1.4 mm thick. In embodiments, the front shell 2 is over 0.1 mm thick, preferably over 0.5 mm thick. Advantageously, the weight of the electrically-controlled optical device is minimized while maintaining a sufficient resistance to impact.

In embodiments, the front shell 2 is configured to form a plano optical lens and/or a convex optical lens and/or a concave optical lens, preferably an ophthalmic lens.

In embodiments, the back surface 6 of the front shell 2 is concave.

In embodiments, the front shell 2 has a dioptric function, for example adapted to the prescription of a user. Advantageously, the front shell 2 combines in a single object the function of correcting the user's vision with the function of protecting the electrically-controlled object 12 from an impact.

The term "prescription" is to be understood to mean a set of optical characteristics of optical power, of astigmatism, of prismatic deviation, and, where relevant, of addition, determined by an ophthalmologist or optometrist in order to correct the vision defects of the user, for example by means of a lens positioned in front of his eye.

For example, the prescription for a progressive addition lens comprises values of optical power and of astigmatism at the distance-vision point and, where appropriate, an addition value. The prescription data may include data for emmetrope eyes.

The front shell 2 may comprise a passive wave guide. Light that is coupled into the wave guide will propagate along the wave guide by total internal reflection. The wave guide comprises two opposite transparent walls with a gap either hollow or filled with a substrate. The length of the gap between the two opposite walls is determined so that light of a chosen wavelength may propagate through the wave guide by reflecting repeatedly on both opposite walls.

The front shell 2 may comprise a passive holographic mirror. A holographic mirror is defined as being recorded using a holography process. The mirror is used to reflect a light beam generated from an image source, so as to cause the visualization of the image by the wearer. The holographic mirror is not used to reconstruct a recorded holographic image (as is the case in traditional hologram viewing). Due to the recording, the mirror is imparted an optical function, that is able, where applicable to modify the wavefront of the light beam stemming from the image source, upon reflection onto said mirror. This allows correcting the virtual vision of the wearer, because the optical lens incorporating the holographic mirror can modify the light beam that generates the image in the eye of the wearer.

When passive elements are used (wave guide or holographic mirror), the electrically controlled object of the invention may be placed in front of the passive element, so as to improve the contrast of the image obtained with the passive element.

According to the invention, the front shell 2 comprises at least one functional layer 8 arranged on the back surface 6.

The at least one functional layer 8 may comprise an antireflective coating and/or a transparent conductive layer, preferably made of indium-tin oxide, indium zinc oxide, aluminium zinc oxide or gallium zinc oxide.

According to the invention, the front shell 2 comprises one primer layer 10 arranged between the at least one functional layer 8 and the back surface 6.

In embodiments, the primer layer 10 is conformed such that the electrically-controlled optical device is mechanically resistant to an impact energy of at least 200 mJ.

An impact test may be performed. The impact test may be the so called "drop ball test" corresponding to the requirements for impact resistance issued by the Food and Drug Administration (FDA). According to the drop ball test a ⅝-inch (1.5875 cm) steel ball weighing approximately 0.56 ounce (15.87573 g) is dropped from a height of 50 inches (127 cm) upon the horizontal convex upper surface of the electrically-controlled optical device. The ball shall strike within a ⅝-inch (1.5875 cm) diameter circle located at the geometric center of the electrically-controlled optical device.

The ball may be guided but not restricted in its fall by being dropped through a tube extending to within approximately 4 inches (10.16 cm) of the optical device. To pass the drop ball test, the optical device must not fracture.

An optical device is considered fractured when it cracks through its entire thickness including a laminar layer if any and across a complete diameter into two or more separate pieces, or any material visible to the naked eye becomes detached from the surface of the optical device which is intended to be facing the eye when the optical device is positioned in front of the eye.

The electrically-controlled optical device according to the invention passes the drop ball test because the front shell 2 does not fracture or shatter, thanks to the primer layer 10.

To be compliant with the FDA standard a production sample is tested and the probability of failure must be below 6.5%.

In embodiments, the primer layer 10 has a thickness less than 4 µm, notably less than 3 µm, advantageously less than 2 µm. Advantageously the thickness and weight of the primer layer is negligible over the total thickness and weight of the electrically-controlled optical device. Advantageously, minimizing the thickness of the primer layer 10 contributes in minimizing haze on the electrically-controlled optical device.

In embodiments, the primer layer 10 has a thickness greater than 0.1 µm, notably greater than 0.2 µm, advantageously greater than 0.4 µm.

In embodiments, the primer layer 10 is resistant to a temperature of at least 100° C., preferably 200° C., notably at least 250° C., advantageously at least 300° C. Advantageously, during manufacturing, the at least one functional layer 8 may be applied through a sputtering method at a predetermined sputtering temperature at which the primer layer 10 remains unaltered. Advantageously, applying the at least one functional layer 8 at such high temperatures contributes in minimizing haze on the optical device.

In embodiments, the primer layer 10 is made in a material resisting all the process conditions undergone by mineral glass shells during manufacturing, including high temperature above 200° C., vacuum and cleaning processes.

In embodiments, the primer layer 10 is made of a polymer or a sol-gel material or a composite organic/inorganic material. Possible materials include silicon resins, polyesters, polyimides polysiloxanes, polytitanocarbosilanes, alkoxysilanes, or mixtures or copolymers of these materials. Colloids may be added to the material, in particular graphenes, metal oxide particles like silicon dioxide particle, titanium oxide particles or zirconium oxide particles. Compositions can be either in solvent or in water based solutions. Some of them can also be applied by dry deposition processes, like for instance plasma enhanced vapor deposition or chemical vapor deposition. Some additives can be added in their formulations in order to improve the coating process like surfactants or cosolvents or in order to improve their mechanical properties like thermal or UV crosslinkers, or in order to improve their thermal or photostability like antioxidisers or UV absorbers, or also to modify their optical properties like their refractive index, their UV absorption.

Primer can be either thermal or UV cured. In some cases, curing of the primer under an inert atmosphere, like under nitrogen, could be needed to avoid a yellowing of the primer during the curing step.

In embodiments, the primer layer 10 is configured to form a refractive index adaptative layer between the slab 3 and the functional layer 8. Indeed, if refractive indices of the slab 3 and the functional layer 8 are different, some light reflection will occur at the interface. By selection of the refractive index of primer layer 10 between the refractive index of the slab 3 and the refractive index of the functional layer 8, light reflection may be lowered, thus improving the overall transparency of the electrically-controlled optical device.

In embodiments, the primer layer 10 may extend over the back surface 6 of the slab 3. Alternately, the front shell 2 may comprise a second primer layer (not represented) arranged on the front surface 4.

The primer layer must indeed support the heat treatment that will be applied during the functional layer deposition processes. Heat resistant primer layers are preferred, especially when high conductivity coatings are required because they are usually applied at temperature above 150° C. or 200° C.

For instance, silicone resins are known to produce films with very good heat resistance and adjustable flexibility or hardness due to their tridimensional structures. The silicone resins having methyl and phenyl substituents have particularly very good heat resistance. For example, a commercial resin from Shin Etsu (KR 300) based on methyl/phenyl silicone chemistry was used as the primer. This resin was deposited by spin coating on the concave side of glass shells having a thickness of 0.85 mm. The thickness of the resin was 3 µm. ITO coating was deposited by sputtering on this silicone layer in order to obtain a surface sheet resistance of about 10 ohm/square. A very good impact resistance was obtained. Without this primer layer, the glass shells did not pass the FDA drop ball test. With this primer layer, the front shell alone passes the FDA drop ball test with success as well as cells made with this primer coated front shell.

Polyimides are also interesting as primer materials since some of them can withstand high curing temperatures and processes of 200° C., 250° C. or 300° C. or even more. For instance, some polyimides resins from Nissan Chemical Industries under the trade mark Sunever could be used.

Some polyester resins can also be used. Some of them have high heat resistance temperature. Polyvinyl esters resins have usually a higher temperature resistance than unsaturated polyesters resins. Some fluorosilicone modified polyester resins are also known to have higher heat resistance than polyester resins alone.

Other composite organic-inorganic hybrid materials are also suitable primer materials. They can indeed have a high temperature resistance. For instance, a composition in methanol comprising 20-30% of glycidoxypropyltrimethoxysilane, 10-20% of tetraethoxysilane and a catalyst may be used.

According to the invention, the electrically-controlled object 12 faces the back surface of the front shell 2.

In embodiments, the electrically-controlled optical object 12 comprises an element placed in electrical contact with the conductive layers.

The element may comprise an electrically-controlled active lens. The element may have a dioptric function which may be adapted to prescription data of the user.

The element may comprise an electrochromic material layer of an electrochromic cell between two transparent supports, wherein one transparent support is the front shell 2. The electrochromic cell comprises at least one electrochromic dye compound having an oxidation potential and undergoing one optical property change upon application of an electrical field between transparent supports using at least two transparent electrodes. For example, a dye may be uncolored in an oxidation state and yellow, green, blue or violet in another oxidation state. The oxidation state of the dye may be controlled by applying an electric field, in other words a voltage, between the electrodes and to the electrochromic dye compound.

The element may comprise a liquid crystal layer of a liquid crystal cell comprising at least one liquid crystalline substance between two transparent supports, wherein one transparent support is the front shell 2. At least one of the transparent supports, for example both of the transparent supports, comprises at least one transparent electrode. The liquid crystal cell alters light based on the optical properties of the liquid crystalline substance in the presence or absence of an electric field, in other words a voltage, applied between the electrodes and to the liquid crystalline substance.

The element may comprise an electro-active wave guide. The wave guide comprises two opposite transparent walls with a gap either hollow or filled with a substrate. The length of the gap between the two opposite walls is determined so that light of a chosen wavelength may propagate through the wave guide by reflecting repeatedly on both opposite walls. The electro-active wave guide may comprise one or more areas of tunable optical properties such as value of refractive index/indices, phase, reflectivity (value, angle, wavelengths or spectral curve), transmittance, etc. For example the walls may each comprise a transparent electrode, the gap is filled with a substrate and the active optical waveguide alters the propagation of light based on the refraction index of the substrate in the presence or absence of an electric field, in other words a voltage applied between the electrodes and to the substrate. The length of the gap may also be commanded.

The element may comprise an electro-active spatial light modulator.

The element may comprise an electro-active holographic mirror. The holographic mirror may comprise one or more areas of tunable optical properties, such as value of refractive index/indices, phase, reflectivity (value, angle, wavelengths or spectral curve), transmittance, etc. . . . .

As illustrated on FIG. 1B, the electrically-controlled optical device may further comprise a back shell 14 facing the front shell 2, the back shell being arranged such that the electrically-controlled optical object 12 is located between the back shell 14 and the front shell 2.

Of course, any of the features described above regarding the front shell 2, or combination thereof, are also applicable for the back shell 14.

Another object of the invention is a method for manufacturing the front shell 2 of an electrically-controlled optical device intended to be placed before a user's eye.

The front shell 2 defines a front surface 4 and a back surface 6 opposed to the front surface 4.

Figure 2:
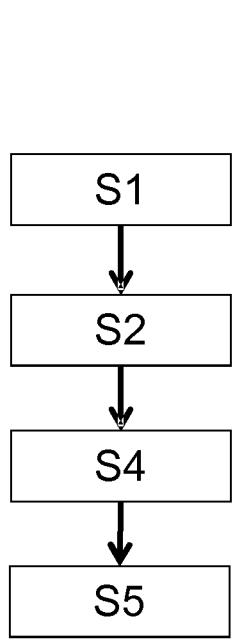
FIG. 2 is a flowchart of different steps of a method for manufacturing an electrically-controlled optical device according to the invention.

As illustrated on FIG. 2, the method comprises the following steps:
- a step S1 of providing a slab 3;
- a step S2 of depositing a primer layer 10 on at least the back surface of the slab 3;
- a step S4 of curing the primer layer 10 deposited on the slab 3 at a curing temperature; and
- a step S5 of applying the at least one functional layer 8 on the primer layer 10 so that the at least one functional layer 8 is arranged on at least the back surface 6 of the front shell 2.

The step S2 of depositing the primer layer 10 may be performed by wet coating processes like for instance spin coating dip coating, spray coating, slit coating, inkjet coating or drop jetting.

During the step S2 of depositing the primer layer 10, the primer layer 10 may be deposited also on the front surface 4 of the front shell 2.

During the step S4 of curing the primer layer 10 deposited on the front shell 2, the curing temperature may be above 200° C., preferably above 250° C. and more preferably above 300° C.

During the step S5 of applying the at least one functional layer 8, the at least one functional layer 8 may be applied through a sputtering method at a predetermined sputtering temperature. In embodiments, the predetermined sputtering temperature is higher than 200° C., notably higher than 250° C., advantageously higher than 300° C.

Alternately, the at least one functional layer 8 may be applied through a vapor deposition method.

Figure 3:
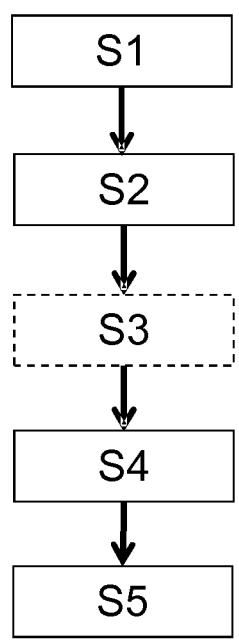
FIGS. 3 and 4 are flowcharts of different steps of a method for manufacturing an electrically-controlled optical device according to embodiments of the invention.

As illustrated on FIG. 3, the method may comprise a pre-curing step S3 prior to the curing step S4, during which the primer layer 10 deposited on the front shell 2 is pre-cured, for example at 100° C. during 15 min. Advantageously, in the case where the primer layer originates from a solvent or a water based solution, most of the solvent is eliminated during the pre-curing step.

Pre-curing may be also obtained with UV exposure, so as to obtain a first level of crosslinking in the primer, enabling easy handling or primer gellation. Final curing step will complete cross linking and/or polymerization of the primer.

Figure 4:
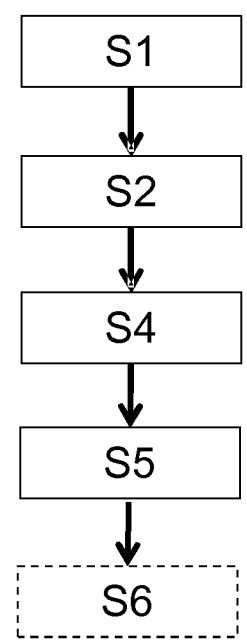

As illustrated on FIG. 4, the method may comprise a post-curing step S6 after the step S5 of applying the at least one functional layer 8. The post-curing step S6 may comprise maintaining the front shell 2 comprising the slab 3, the primer layer 10 and the at least one functional layer 8 at a temperature similar to, or slightly inferior to, the curing temperature during an extended period of time, such as one hour or more. Typically the post-curing step S6 is performed when the electrically-controlled optical device also comprises a back shell 14. Advantageously, the electrically-controlled optical device yields improved transparency properties.

The method may comprise both a pre-curing step S3 and a post-curing step S6.

The invention has been described above with the aid of embodiments without limitation of the general inventive concept.

Many further modifications and variations will suggest themselves to those skilled in the art upon making reference to the foregoing illustrative embodiments, which are given by way of example only and which are not intended to limit the scope of the invention, that being determined solely by the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. An electrically-controlled optical device to be placed in front of a user's eye, the electrically-controlled optical device being an ophthalmic device, the electrically-controlled optical device comprising:
   a front shell defining a front surface and a back surface opposed to the front surface, the front shell comprising a slab, at least one functional layer arranged on the back surface and one primer layer, said primer layer being arranged between the at least one functional layer and the slab; and
   an electrically-controlled object facing the back surface of the front shell,
   wherein the primer layer is conformed such that the electrically-controlled optical device is mechanically resistant to an impact energy of at least 200 mJ, and
   wherein the primer layer is configured to form a refractive index adaptive layer.

2. The electrically-controlled optical device according to claim 1, wherein the slab is made of mineral material.

3. The electrically-controlled optical device according to claim 1, wherein the front shell is less than 1.7 mm thick.

4. The electrically-controlled optical device according to claim 1, wherein the primer layer has a thickness less than 4 μm.

5. The electrically-controlled optical device according to claim 1, wherein the primer layer is resistant to a temperature of at least 100° C.

6. The electrically-controlled optical device according to claim 1, further comprising a back shell facing the front shell, the back shell being arranged such that the electrically-controlled object is located between the back shell and the front shell, and wherein the at least one functional layer comprises a transparent conductive layer.

7. The electrically-controlled optical device according to claim 6, further comprising an element placed in electrical contact with the transparent conductive layer, the element being selected from the group consisting of a liquid crystals layer, an electrochromic material layer.

8. The electrically-controlled optical device according to claim 1, wherein the back surface of the front shell is concave.

9. The electrically-controlled optical device according to claim 1, wherein the electrically-controlled optical device has a transmittance function to actively protect against glare.

10. The electrically-controlled optical device according to claim 1, wherein the primer layer has a thickness less than 3 μm.

11. The electrically-controlled optical device according to claim 1, wherein the primer layer has a thickness less than 2 μm.

12. The electrically-controlled optical device according to claim 1, wherein the primer layer is made of a polymer or a sol-gel material or a composite organic/inorganic material.

13. A method for manufacturing a front shell of an electrically-controlled optical device to be placed before a user's eye and having a primer layer conformed such that the electrically-controlled optical device is mechanically resistant to an impact energy of at least 200 mJ, the primer layer being made of a polymer or a sol-gel material or a composite organic/inorganic material, the method comprising:
   providing a slab having a front surface and a back surface;
   depositing the primer layer on at least the back surface of the slab;
   curing the primer layer deposited on the slab at a curing temperature; and
   applying at least one functional layer on the primer layer so that the at least one functional layer is arranged on at least the back surface of the front shell, the primer lave being configured to form a refractive index adaptative layer.

14. The method according to claim 13, wherein the at least one functional layer is applied through a sputtering method at a predetermined sputtering temperature.

15. The method according to claim 14, wherein the predetermined sputtering temperature is at least 100° C.

* * * * *